(12) United States Patent
Gilbert (10) Patent No.: US 11,855,591 B2
(45) Date of Patent: Dec. 26, 2023

(54) SIGNAL COMBINER (71) Applicant: NEWSOUTH INNOVATIONS PTY LIMITED, Kensington (AU)

(72) Inventor: William James Gilbert, Kensington (AU)

(73) Assignee: Diraq Pty Ltd, Elizabeth Bay (AU)

(*) Notice: Subject to any disclaimer, the term of this patent is extended or adjusted under 35 U.S.C. 154(b) by 340 days.

(21) Appl. No.: 17/291,740

(22) PCT Filed: Nov. 12, 2019

(86) PCT No.: PCT/AU2019/051243
§ 371 (c)(1),
(2) Date: May 6, 2021

(87) PCT Pub. No.: WO2020/097676
PCT Pub. Date: May 22, 2020

(65) Prior Publication Data
US 2022/0012620 A1  Jan. 13, 2022

(30) Foreign Application Priority Data

Nov. 12, 2018 (AU) .................. 2018904404

(51) Int. Cl.
*H02M 7/02* (2006.01)
*G06N 10/00* (2022.01)
*H03F 3/213* (2006.01)
(52) U.S. Cl.
CPC .............. *G06N 10/00* (2019.01); *H02M 7/02* (2013.01); *H03F 3/213* (2013.01)

(58) Field of Classification Search
CPC .......... G06N 10/00; H02M 7/02; H03F 3/213; H01L 29/66977; H01L 29/7613; H01L 29/94; H03H 7/46; B82Y 10/00
See application file for complete search history.

(56) References Cited

U.S. PATENT DOCUMENTS

| 3,382,451 | A  | * | 5/1968 | Gillette | ............. | G01R 19/0084 |
| | | | | | | 324/123 R |
| 6,229,408 | B1 | | 5/2001 | Jovanovich et al. | | |
| 9,401,766 | B2 | * | 7/2016 | Yuan | ..................... | H04B 10/70 |
| 9,892,365 | B2 | | 2/2018 | Rigetti et al. | | |
| 2003/0080623 | A1 | | 5/2003 | MacDonald et al. | | |
| 2005/0270816 | A1 | * | 12/2005 | Nielsen | ................... | H02M 1/10 |
| | | | | | | 363/142 |

(Continued)

FOREIGN PATENT DOCUMENTS

| CN | 104363674 A | 2/2015 |
| EP | 2921869 A2 | 9/2015 |

OTHER PUBLICATIONS

Written Opinion and International Search Report of PCT/AU2019/051243; dated Feb. 6, 2020.

(Continued)

*Primary Examiner* — S M Sohel Imtiaz
(74) *Attorney, Agent, or Firm* — Polsinelli PC (57) ABSTRACT

The present disclosure relates to a new combiner/attenuator circuit that provides improved performance, specifically the combiner/attenuator circuit disclosed is capable of operating at a temperature of 4K and provides an improved frequency response and filtering.

20 Claims, 5 Drawing Sheets

(56) References Cited

U.S. PATENT DOCUMENTS

| | | | | |
|---|---|---|---|---|
| 2013/0308356 A1* | 11/2013 | Subramanium | ......... | H02J 3/381 |
| | | | | 363/53 |
| 2014/0159605 A1* | 6/2014 | Deng | ................... | H05B 45/382 |
| | | | | 315/200 R |
| 2018/0212531 A1* | 7/2018 | Hurwitz | ................ | H02M 7/217 |
| 2020/0028480 A1* | 1/2020 | Abdo | ....................... | H03H 7/46 |

OTHER PUBLICATIONS

Extended European Search Report for EP Application No. 19884775.8, dated Jul. 21, 2022, 6 pages.
Watson, T. F. et al: "A Programmable two-qubit quantum processor in silicon"; arxiv.org, Cornell University Library, Ithaca, NY; Aug. 14, 2017; 22 pages.
English translation of CN 104363674 A, 6 pages.

\* cited by examiner

SIGNAL COMBINER

CROSS-REFERENCE TO RELATED APPLICATIONS

This application is a national stage application of International Application No. PCT/AU2019/051243, which was filed on Nov. 12, 2019, which claims priority to Australian Application Number 2018904404 filed on Nov. 12, 2018, of which is incorporated by reference in its entirety.

TECHNICAL FIELD

The present invention relates to an electronic circuit for combining DC and AC signals.

Background

Signal combiners are used in electronic circuits to combine AC and DC signals. Several circuit configurations that can be used as signal combiners are known in the art, for example purely resistive networks can be used as signal combiners.

U.S. Pat. No. 9,886,668 discloses a quantum computing apparatus that requires electronic signals to control and operate quantum dot-based qubits. The delivery of such control signals to the qubits presents many challenges and current signal combiners do not perform efficiently in several areas, including the delivery of high bandwidth for fast pulses together with linear DC coupling.

Common solutions to combiner limitations include AC coupling of the Arbitrary Waveform Generator (AWG), which induces loss of linearity at longer timescales, or use of a different impedance (instead of the conventional 50Ω) that, in turn, affects the bandwidth.

There is a need in the art for improvement.

SUMMARY

In a first aspect, the present invention provides an electronic combiner circuit comprising:
  a DC bias input, an AC control input and a signal output; the DC bias input being arranged to receive a DC signal and couple the DC signal to the signal output in DC; the AC control input being arranged to receive an AC signal and couple the AC signal to the signal output at any frequency; the signal output being arranged to provide a combined signal for operating a quantum device;
  a first conductive path arranged between the AC input and the signal output; the first conductive path being such that the DC component of a signal provided at the AC input is prevented from being transmitted from the AC input to the signal output along the first conductive path;
  a second conductive path arranged between the AC input and the signal output; the second conductive path being such that the DC component of a signal provided at the AC input transmits from the AC input to the signal output along the second conductive path.

In an embodiment, the first conductive path comprises a filter circuit. The filter may comprise an attenuator. The filter may comprise one or more filtering stages. The filter may be such that the impedance of the first conductive path is matched to the AC input and a load of the combiner circuit.

In an embodiment, the first conductive path is a 50Ω path.

In an embodiment, the second conductive path comprises a filter circuit and/or a variable attenuation circuit.

In embodiments, the variable attenuator of the second conductive path is configured to provide a 50:1 attenuation ratio within a main bandwidth of the filter circuit of the second conductive path and a nominal attenuation of 25:1 at low-frequencies outside of the main bandwidth of the filter circuit of the second conductive path.

In an embodiment, the conductive path between the DC input and the output comprises a low-pass filter circuit. The low-pass filter circuit may comprise one or more stages.

In accordance with a second aspect, the present invention provides, a quantum computer comprising one or more electronic combiner circuits in accordance with the first aspect.

Advantages of the combiner circuit disclosed herein comprise high bandwidth and linear combination to DC. In addition, the combiner improves on the prior art, providing signal combination with high bandwidth whilst being DC coupled.

BRIEF DESCRIPTION OF THE DRAWINGS

A preferred embodiment of the present invention will now be described, by way of example only, with reference to the accompanying drawings, in which.

DETAILED DESCRIPTION

The present disclosure is directed to a new combiner/attenuator circuit that provides improved performance. In embodiments, the combiner/attenuator circuit disclosed is capable of operating at a temperature of 4K and provides an improved frequency response and filtering.

The combiner/attenuator disclosed addresses several challenges related to the control and measurement of solid-state quantum systems, such as providing an ultra-low noise stable DC bias combined with fast pulses from an Arbitrary Waveform Generator (AWG) connected to an AC control input that allows controlling properties of the quantum system. In particular, the electronic combiner provides: a linear DC-coupled signal path to avoid pulse decay and drift due to changes in duty cycle; attenuation of both inputs to reduce noise and improve DAC resolution; low power consumption from the DC input due to the low current capability of most low noise DC sources.

Figure 1:
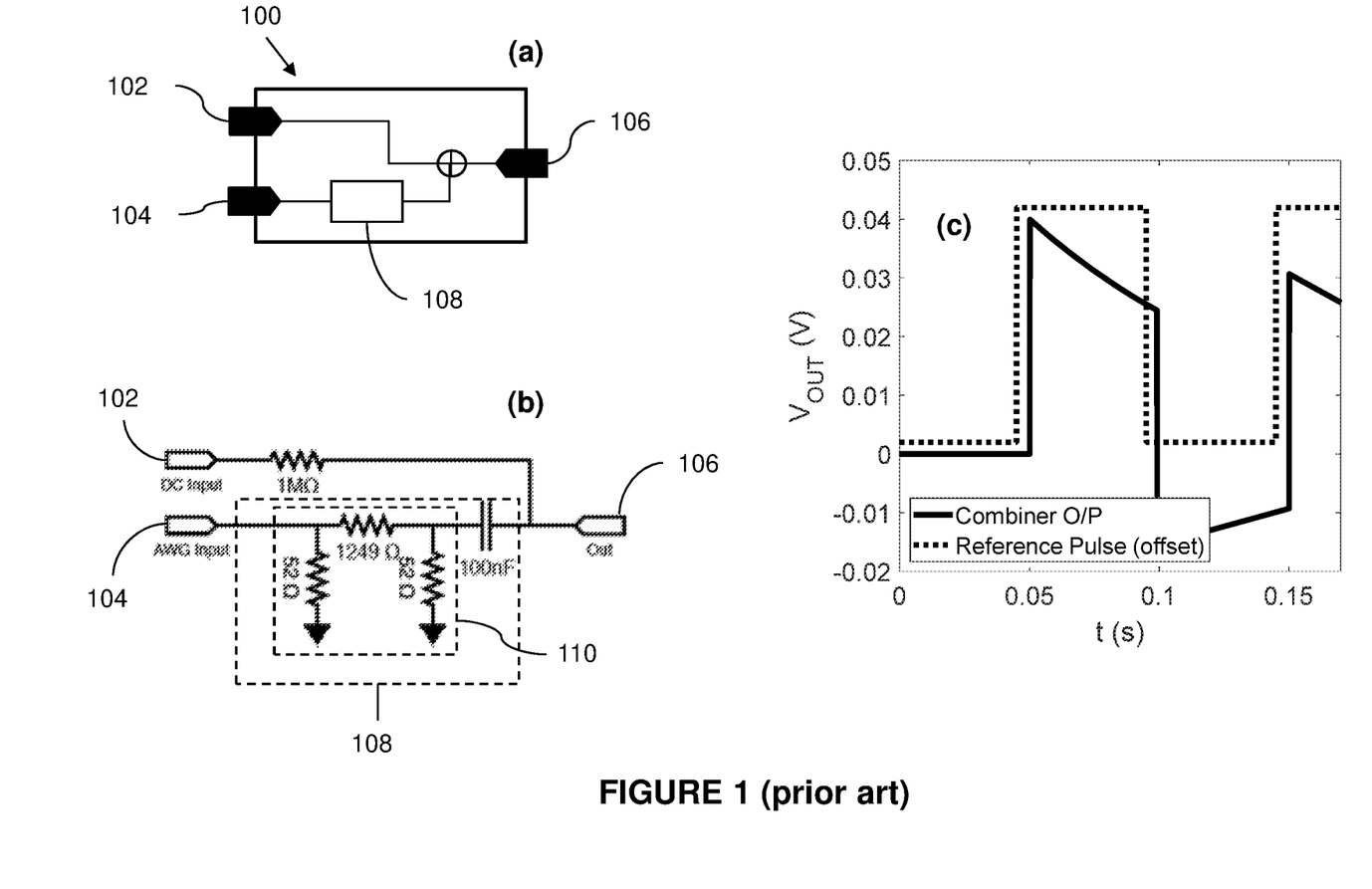
FIG. 1 shows an example of electronic combiner circuit known in the art.

Referring now to FIG. 1, there is shown a combiner circuit for driving fast signals onto MOS Gates as known in the art. FIG. 1(a) shows a simplified schematic 100 of the combiner circuit, this has a DC bias input 102, an AC control input 104 and a signal output 106. An electronic filter 108 is present between the AC control input 104 and the signal output 106 to filter the AC signal.

The DC bias input 102 and the AC control input 104 are coupled to the signal output 106 to transmit both DC and a signal with a given frequency through discrete components. An example of this is shown in FIG. 1(b) where a 1 MΩ resistor is used between the DC bias input 102 and the signal output 106. Electronic filter 108 comprises a pi-attenuator 110 connected to the AC control input 104, which is then AC-coupled to the signal output 106 via a 100 nF capacitor. In some combiner circuits, the pi-attenuator 110 is not used.

To drive fast signals throughout a non-integrated environment, an impedance matched setup must be used. A primary limitation of devices to date is that high impedances cause reflections and poor bandwidth. However, it is seldom possible to place a 50Ω termination at the end of the signal path when working with solid state quantum dots, due to the excessive heat that would be generated in a tightly constrained cryogenic environment. Instead, reflections are expected from what are essentially open circuit gate electrodes and can be terminated somewhere upstream to prevent transient oscillations at the device.

Typical 50Ω sources generate an internal voltage that is double the voltage that would be seen at the output, due to the 50Ω source impedance required to match it to a 50Ω system. With an open circuit load, the output voltage of a 50Ω source will be the internal doubled voltage rather than what is intended. Therefore, it is easier to manage a true open circuit load than something in between, with even 1 MΩ oscilloscope inputs causing some problems in high impedance regimes.

Typical 50Ω resistive combiners, where all inputs and outputs are impedance matched, are linear to DC and can have extremely high bandwidth. However, resistive combiners of this type draw excessive current to be used with low noise DC sources which are required for operating high-fidelity quantum dot systems.

Bias-Tees which are commonly used in radio-frequency and microwave systems enable combination of AC and DC signals without drawing excessive currents. However, these rely on AC-coupling of the high frequencies of the input signal, therefore preventing signal combination at low frequencies and DC. In turn, this causes longer pulses or low frequency signals to be distorted as shown in FIG. 1(c) where the combiner output (solid line) is distorted in comparison to the reference pulse (dashed line) due to the AC-coupling capacitor.

Figure 2:
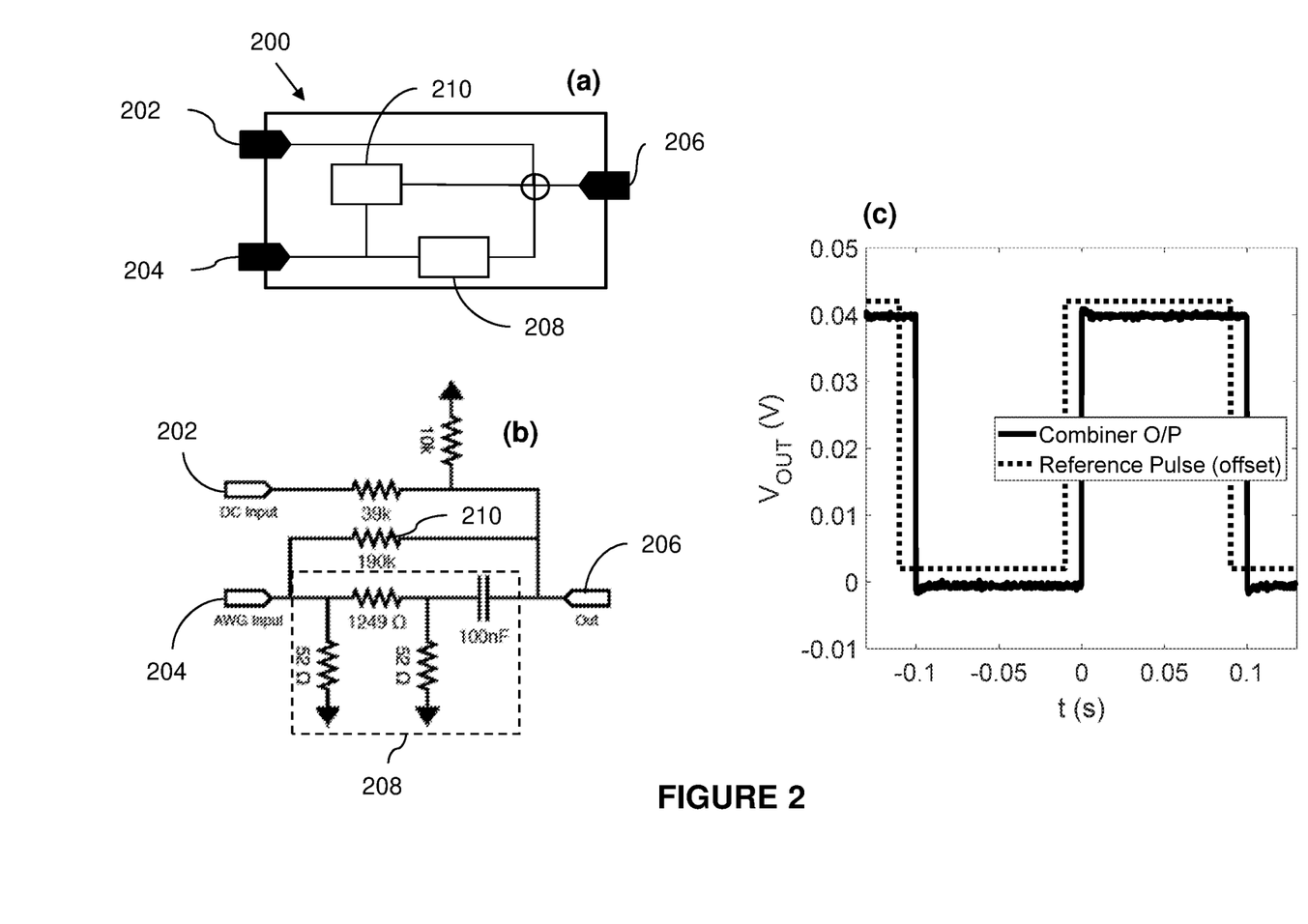
FIGS. 2 to 4 show electronic combiner circuits in accordance with embodiments and respective electrical measurements.

Referring now to FIG. 2, there is shown a combiner circuit in accordance with embodiments. FIG. 2(a) shows a simplified schematic 200 of the combiner circuit. The circuit has a DC bias input 202, an AC control input 204 and a signal output 206 similarly to the combiner 100 described with reference to FIG. 1(a). An electronic filter 208 is present between the AC control input 204 and the signal output 206 to filter the AC signal. The DC bias input 202 has an input port that receives a DC signal and couples it to the signal output in DC; the AC control input 204 has an input port suitable to couple to a coaxial cable and receive an AC signal that is coupled to the signal output 206 at any frequency. The signal output 206 provides a combined signal for operating a quantum device.

There is a first conductive path between the AC input 204 and the signal output 206 that comprises a band-pass electronic filter 208. The filter 208 prevents the DC component of a signal provided at the AC input 204 from being transmitted from the AC input 204 to the signal output 206 along the first conductive path. In addition, a second conductive path is present in device 200 between the AC input 204 and the signal output 206. The second conductive path allows transmission of at least a portion of the DC component of the signal provided at the AC input to the signal output 206. In the example shown in FIG. 2(b), a 190 kΩ resistor is used to connect the AC input 204 and the signal output 106. The second conductive path has a matched attenuation to the 50Ω path, which prevents pulse decay on the other side of the AC side.

The combiner of FIG. 2(b) provides improvements in all areas demonstrating that the signal combination can be achieved with high bandwidth whilst being DC coupled.

The nominal attenuation factor between the AC Input 204 where the AWG is connected and output 206 is 25:1. The load that the combiner is designed to drive can be approximated as an open-circuit load when described in a 50Ω system. This open-circuit load has the effect of doubling the voltage of signals incident on it from a 50Ω transmission line. In order to achieve a 25:1 voltage attenuation factor, a 50:1 voltage attenuation must be obtained along the first conductive path 208 of combiner 200. The attenuation factor of the second conductive path remains 25:1 since it is not affected by high frequency transmission line effects.

FIG. 2(c) shows performance of the combiner design shown in FIG. 2(b). It demonstrates that low frequency signals are not distorted by the combiner design due to the addition of the second conductive path 210. This is an advancement on the prior art.

Figure 3:
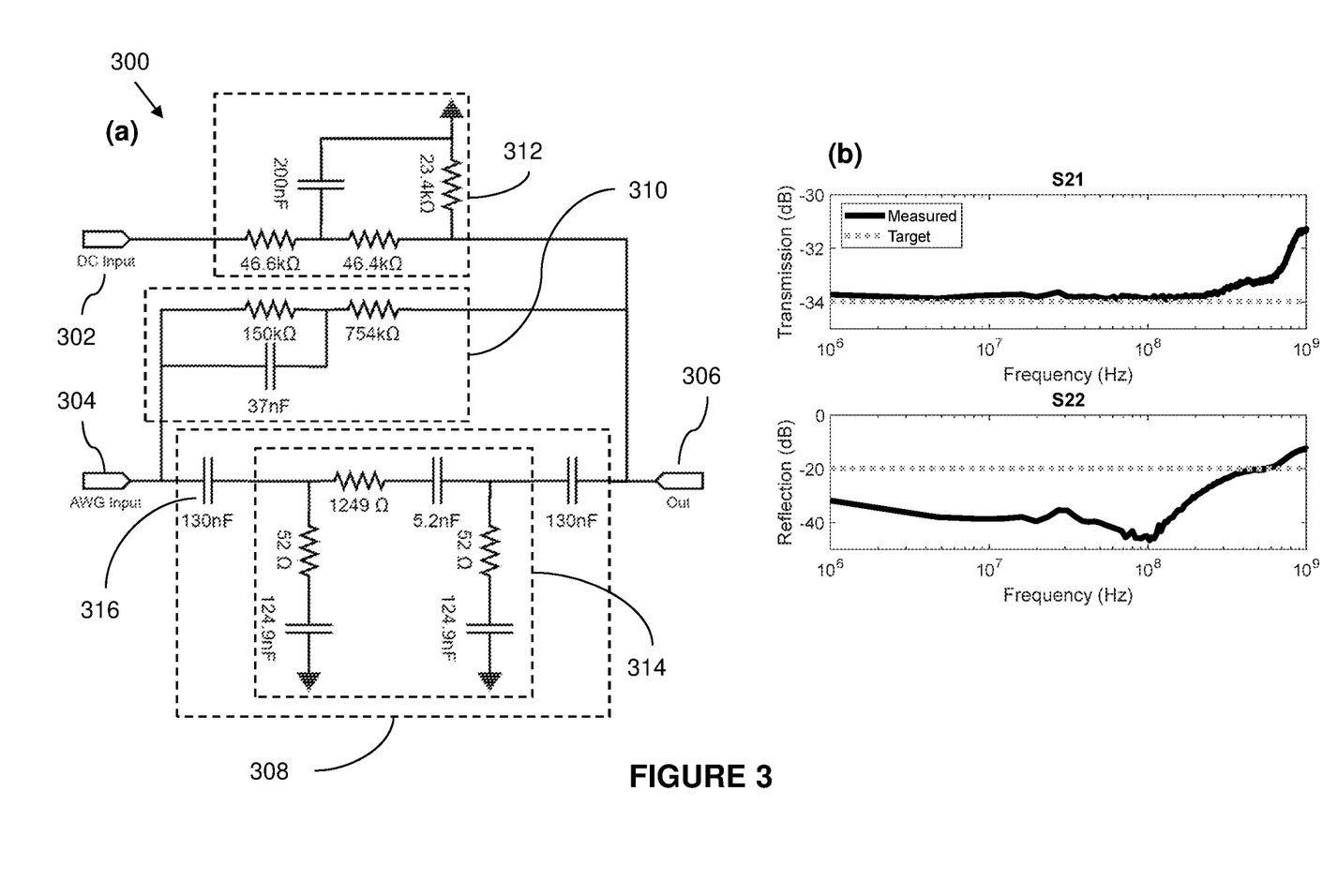

Referring now to FIG. 3(a), there is shown a 50Ω DC-coupled, ultra-low power cryogenics compatible combiner 300 with DC filtering in accordance with an embodiment. The combiner circuit 300 comprises all the features of the device 200 described with reference to FIG. 2(a). In addition, combiner 300 comprise an electronic low-pass filter 312 between the DC input 302 and the signal output 306. The electronic filter 312 allows to improve significantly the noise environment when the combiner is used to drive MOS-based qubits. The low-pass filter 312 on the DC line requires that the second conductive path between the AC input 304 and output 306 includes a compensatory high-pass filter 310 to prevent distortions.

The high-pass filter 310 allows to compensate for the loading effect of low-pass filter 312 on the signal output 306. The high-pass filter 310 is configured to apply the inverse transfer function to that of the low-pass filter, with the same attenuation and filter time constant. Having the two filters in the circuit allows noise to be filtered from the DC input 302 without adversely affecting signals from the AC input 304.

The RC-network 308 along the first conductive path (50Ω path) in FIG. 3(a) allows reducing the static power consumption of the combiner, when compared for example to the first conductive path of the circuit of FIG. 2(a). For the combiner 300 to be mounted at low temperature and potentially further reduce noise, the static power dissipation must be dramatically reduced. To eliminate the DC-component of the current through the first conductive path 308, a second capacitor 316 is added to the input before the pi-attenuator 314 to block the DC component. Capacitors with equal impedance ratio to the resistors are also added to each branch of pi-attenuator 314, in order to give RC-network 308 the same attenuation factor across all frequencies. In this configuration, the static power consumption of the combiner is confined to only within filters 310 and 312, allowing for ultra-low power operation.

The nominal attenuation factor between the AC Input 304 and the signal output 306 is 25:1, the same as for the circuit of FIG. 2. The addition of a DC-blocking RC network 316 along the first conductive path increases the total impedance at the AC input 304 at lower frequencies, making the high impedance of the second conductive path relevant to the input impedance at the AC input 304 and therefore causing a poor impedance match for the AC signal source (AWG). The poor impedance match causes an increase of the set voltage at the AC input 304 due to signal reflection. In order to compensate for this effect, the attenuation factor that is implemented in the second conductive path is increased to 50:1, to achieve a nominal attenuation factor of 25:1 at low frequencies.

FIG. 3(b) shows performance data from a prototype implementation of the design shown in FIG. 3(a). The upper plot showing transmission, or S21, and the lower plot shows reflection, or S22. Plot S21 shows the attenuation factor of the combiner for AWG signal provided at the AC input 304 and measured at the signal output 306, across a range of frequencies from 1 MHz to 1 GHz. The plot shows adherence to the target attenuation of 34 dB up to input frequencies of 500 MHz; S22 shows the proportion of signals incident on the output port 306 that is reflected from the output 306. Again, adherence to the target specification of less than −20 dB is shown up to frequencies of 500 MHz Referring now to FIG. 4(a), there is shown another ultra-low power, cryogenics compatible combiner 400 in accordance with an embodiment. This design features a lower attenuation factor than the combiner circuit described with reference to FIG. 3(a), and an additional filter stage 412 of the DC-input 402 that provides improved DC filtering.

Figure 4:
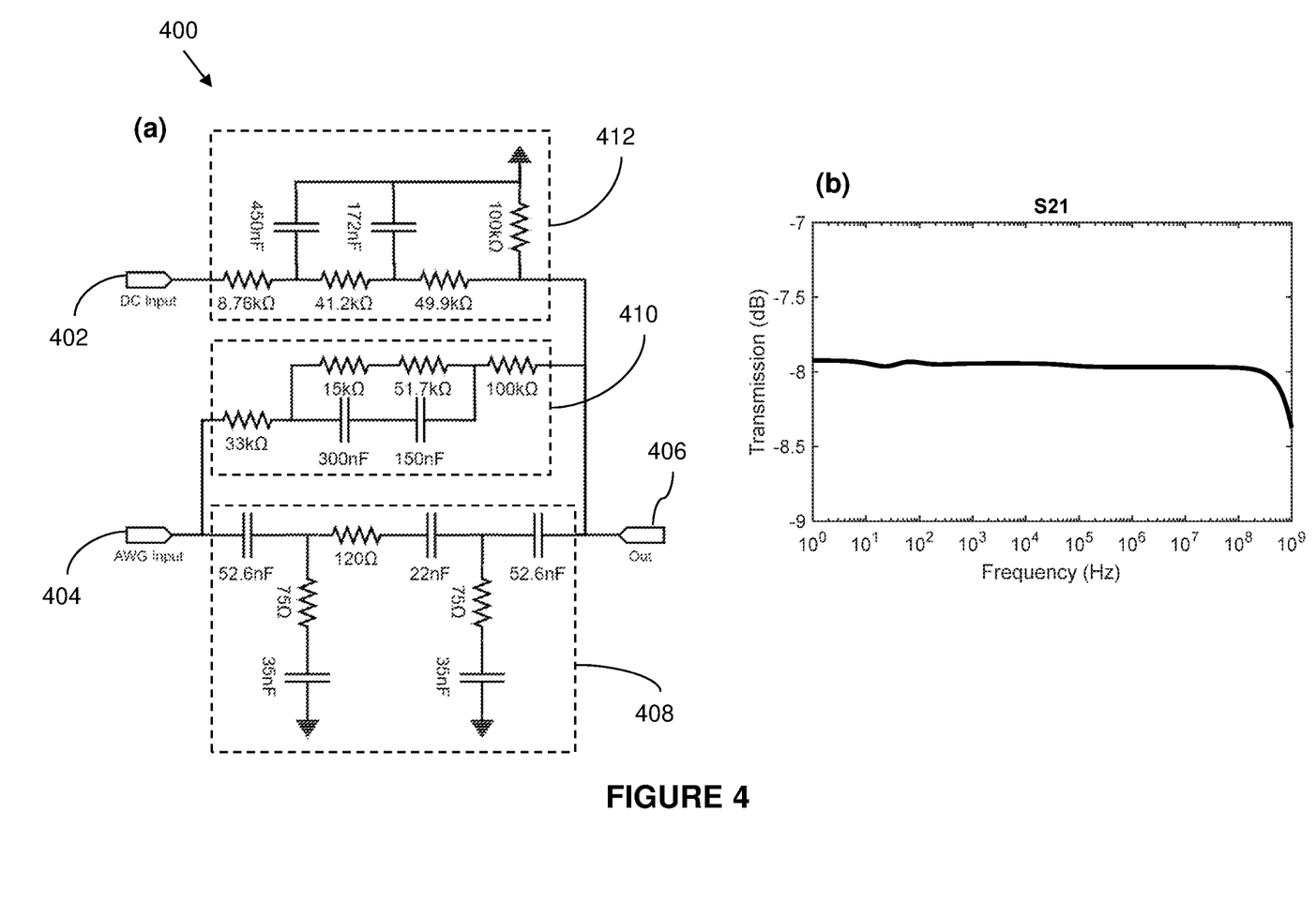

In FIG. 4(b), there is shown simulated performance data for the combiner 400 described in FIG. 4(a), showing a constant attenuation factor of 8 dB from DC to 1 GHz from the AC input 404 to the output 406.

Figure 5:
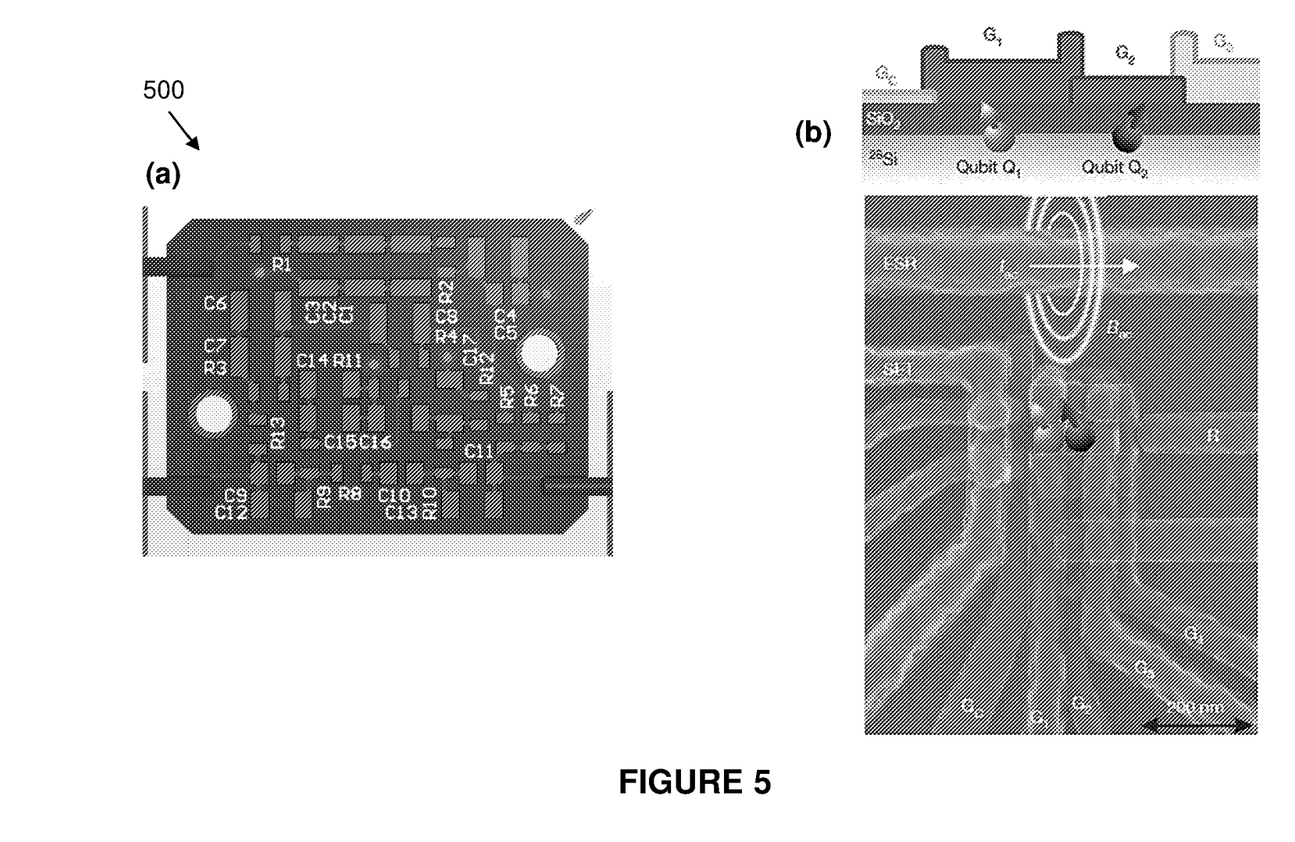
FIG. 5 shows an embodiment of the signal combiner on a PCB board and a scanning electron microscope image of gate electrodes in a Si-MOS quantum dot device that is controlled using a combiner in accordance with embodiments.

In FIG. 5(a) there is shown an embodiment of the signal combiner realized on a PCB board 500 suitable to implement the circuit schematic 400 of FIG. 4(a).

The PCB layout and choices of the components used generally determine the actual bandwidth of the combiner circuit. Current implementations realised by the Inventors maintain a sub-20 dB reflection up to 560 MHz on the fast line, and linear combination down to DC. This provides ample bandwidth to implement a wide range of control and readout techniques of qubits, without changing the system setup, a crucial requirement for future scalability of quantum computing devices.

For convenience, FIG. 5(b) shows an illustration (top) and SEM image (bottom) of gate electrodes in a Si-MOS quantum dot device that is controlled using pulses from the signal output of combiner circuits in accordance with embodiments. The device consists of a silicon substrate, silicon dioxide insulating layer, and aluminium gate electrodes. The gate electrodes are used to electrostatically control quantum dots formed at the interface between the Silicon substrate and the Silicon dioxide insulating layer. The gate electrodes can be treated as open-circuit loads for the purpose of driving high frequency signals in a 50Ω impedance matched system. The quantum dot structure (labels GC and G1-4) can be operated as a single or double quantum dot by appropriate biasing of gate electrodes G1-G4, where each of the gate electrodes G1-G4 are connected to the output of combiner circuits in accordance with embodiments.

Although the invention has been described with reference to a preferred embodiment, it will be appreciated by persons skilled in the art that the invention may be embodied in many other forms and numerous variations and/or modifications may be made to the technology as shown in the specific embodiments without departing from the spirit or scope of technology as broadly described. The present embodiments are, therefore, to be considered in all respects as illustrative and not restrictive.

Definitions

Throughout this specification, unless the context clearly requires otherwise, the word "comprise", or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like which has been included in the present specification is solely for the purpose of providing a context for the present technology. It is not to be taken as an admission that any or all these matters form part of the prior art base or were common general knowledge in the field relevant to the present technology as it existed before the priority date of each claim of this specification.

Unless the context requires otherwise or specifically stated to the contrary, integers, steps, or elements of the technology recited herein as singular integers, steps or elements clearly encompass both singular and plural forms of the recited integers, steps or elements.

In the context of the present specification the terms 'a' and 'an' are used to refer to one or more than one (i.e., at least one) of the grammatical object of the article. By way of example, reference to 'an element' means one element, or more than one element.

The invention claimed is:

1. An electronic combiner circuit comprising:
a Direct Current (DC) bias input, an Alternating Current (AC) control input and a signal output, the DC bias input being arranged to receive a DC signal and couple the DC signal to the signal output in DC, the AC control input being arranged to receive an AC signal and couple the AC signal to the signal output at any frequency, the signal output being arranged to provide a combined signal for operating a quantum device;
a first conductive path arranged between the AC control input and the signal output, the first conductive path being such that a DC component of a signal provided at the AC control input is prevented from being transmitted from the AC control input to the signal output along the first conductive path; and
a second conductive path arranged between the AC control input and the signal outputs the second conductive path being such that the DC component of the signal provided at the AC control input transmits from the AC control input to the signal output along the second conductive path.

2. The electronic combiner circuit of claim 1, wherein the first conductive path comprises a filter circuit.

3. The electronic combiner circuit of claim 2, wherein the filter circuit comprises one or more filtering stages.

4. The electronic combiner circuit of claim 3, wherein the filter circuit comprises an attenuator.

5. The electronic combiner circuit of claim 2, wherein the filter circuit is such that the impedance of the first conductive path is matched to the AC control input and a load of the combiner circuit.

6. The electronic combiner circuit of claim 1, wherein the first conductive path is a 50Ω path.

7. The electronic combiner circuit of claim 1, wherein the second conductive path comprises a filter circuit.

8. The electronic combiner circuit of claim 7, wherein the second conductive path comprises a variable attenuator.

9. The electronic combiner circuit of claim 8, wherein the variable attenuator of the second conductive path is configured to provide a 50:1 attenuation ratio within a main bandwidth of the filter circuit of the second conductive path and a nominal attenuation of 25:1 at low-frequencies outside of the main bandwidth of the filter circuit of the second conductive path.

10. The electronic combiner circuit of claim 1, wherein a conductive path between the DC bias input and the signal output comprises a low-pass filter circuit.

11. The electronic combiner circuit of claim 10, wherein the low-pass filter circuit comprises one or more stages.

12. The electronic combiner circuit of claim 10, wherein the conductive path between the DC bias input and the signal output comprises an attenuator circuit arranged to limit the power dissipated by the combiner circuit.

13. The electronic combiner circuit of claim 1, wherein the combiner circuit is arranged to operate at a temperature of 4K.

14. A quantum computer comprising one or more electronic combiner circuits, wherein at least one of the one or more electronic combiner circuits comprises:
   a Direct Current (DC) bias input, an Alternating Current (AC) control input and a signal output, the DC bias input being arranged to receive a DC signal and couple the DC signal to the signal output in DC, the AC control input being arranged to receive an AC signal and couple the AC signal to the signal output at any frequency, and the signal output being arranged to provide a combined signal for operating the quantum computer;
   a first conductive path arranged between the AC control input and the signal output, the first conductive path being such that a DC component of a signal provided at the AC control input is prevented from being transmitted from the AC control input to the signal output along the first conductive path; and
   a second conductive path arranged between the AC control input and the signal output, the second conductive path being such that the DC component of the signal provided at the AC control input transmits from the AC control input to the signal output along the second conductive path.

15. The quantum computer of claim 14, wherein the first conductive path comprises a filter circuit.

16. The quantum computer of claim 15, wherein the filter circuit comprises one or more filtering stages.

17. The quantum computer of claim 16, wherein the filter circuit comprises an attenuator.

18. The quantum computer of claim 15, wherein the filter circuit is such that the impedance of the first conductive path is matched to the AC control input and a load of the combiner circuit.

19. The quantum computer of claim 14, wherein the first conductive path is a 50 Ω path.

20. The quantum computer of claim 14, wherein the second conductive path comprises a filter circuit.

* * * * *